(12) United States Patent
Tiu et al.

(10) Patent No.: US 9,305,898 B2
(45) Date of Patent: Apr. 5, 2016

(54) SEMICONDUCTOR DEVICE WITH COMBINED POWER AND GROUND RING STRUCTURE

(71) Applicants: Kong Bee Tiu, Port Klang (MY); Ruzaini B. Ibrahim, Bandar Puncak Alam (MY); Wen Shi Koh, Petaling Jaya (MY)

(72) Inventors: Kong Bee Tiu, Port Klang (MY); Ruzaini B. Ibrahim, Bandar Puncak Alam (MY); Wen Shi Koh, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 147 days.

(21) Appl. No.: 14/161,706

(22) Filed: Jan. 23, 2014

(65) Prior Publication Data

US 2015/0206834 A1 Jul. 23, 2015

(51) Int. Cl.
*H01L 23/00* (2006.01)
*H01L 23/495* (2006.01)

(52) U.S. Cl.
CPC .......... *H01L 24/85* (2013.01); *H01L 23/49527* (2013.01); *H01L 23/49551* (2013.01); *H01L 23/49558* (2013.01); *H01L 23/49562* (2013.01); *H01L 24/48* (2013.01); *H01L 24/45* (2013.01); *H01L 24/73* (2013.01); *H01L 2224/05553* (2013.01); *H01L 2224/291* (2013.01); *H01L 2224/2919* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/48247* (2013.01); *H01L 2224/49109* (2013.01); *H01L 2224/73265* (2013.01); *H01L 2224/85* (2013.01); *H01L 2224/92247* (2013.01); *H01L 2924/181* (2013.01); *H01L 2924/19107* (2013.01)

(58) Field of Classification Search
CPC .................................. H01L 23/49541
See application file for complete search history.

(56) References Cited

U.S. PATENT DOCUMENTS

| | | | |
|---|---|---|---|
| 7,543,249 B2 | 6/2009 | Redorta | |
| 7,737,537 B2 * | 6/2010 | Bemmerl | .......... H01L 23/49531 257/666 |
| 7,875,963 B1 | 1/2011 | Kim | |
| 8,030,741 B2 | 10/2011 | Bemmerl | |
| 8,143,914 B2 | 3/2012 | Ogata | |
| 8,188,579 B1 | 5/2012 | Kim | |
| 8,575,742 B1 | 11/2013 | Kim | |
| 2004/0238921 A1 * | 12/2004 | Lee | .................... H01L 23/49503 257/666 |
| 2005/0121753 A1 | 6/2005 | Lee | |
| 2011/0193209 A1 * | 8/2011 | Hung | ...................... H01L 23/13 257/677 |

* cited by examiner

*Primary Examiner* — Lex Malsawma
(74) *Attorney, Agent, or Firm* — Charles E. Bergere

(57) ABSTRACT

A semiconductor device includes a lead frame, and an integrated circuit die. The lead frame has a flag for supporting the die and leads that surround that flag and die. The lead frame also has ground ring that surrounds the flag and die. First bond wires electrically connect the die to the lead frame leads. An insulating layer is disposed on the ground ring, and a power layer is disposed on the insulating layer. The semiconductor device further includes second bond wires that connect the die to the ground ring and third bond wires that connect the die to the power layer.

10 Claims, 4 Drawing Sheets

SEMICONDUCTOR DEVICE WITH COMBINED POWER AND GROUND RING STRUCTURE

BACKGROUND OF THE INVENTION

The present invention relates generally to semiconductor packaging and, more particularly, to a lead frame based semiconductor package having a combined power and ground ring structure.

Certain semiconductor packages, such as quad flat (QFP) packages, quad flat no-lead (QFN) packages, and power QFN (PQFN) packages, include one or more integrated circuit (IC) dies and/or other active components physically attached to a lead frame and electrically connected to leads of the lead frame with a plurality of bond wires that span die pads on the die to respective leads of the lead frame. The IC dies, bond wires, and an interior portion of the lead frame are encapsulated by a mold compound, leaving a portion of the leads on the surface of the package exposed. These exposed leads serve as input and output (I/O) connections to the encapsulated IC dies and are typically located along a periphery of the package. QFPs have relatively short electrical paths and fast signal communication rates and are therefore widely used.

In some QFP packages, connections between bonding pads on the IC dies and a power source are made via one or more dedicated power bars, which serve as hubs, disposed within the QFP package. In such devices, a plurality of leads of the lead frame, referred to as dummy leads, are not only electrically coupled to the one or more power bars but also provide structural support to the one or more power bars. However, such use of package leads as dummy leads reduces the total number of package leads available for input/output (I/O) interconnection.

Accordingly, it would be advantageous to have a semiconductor device that can provide the advantages of dedicated power bars without using dummy leads.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Figure 1:
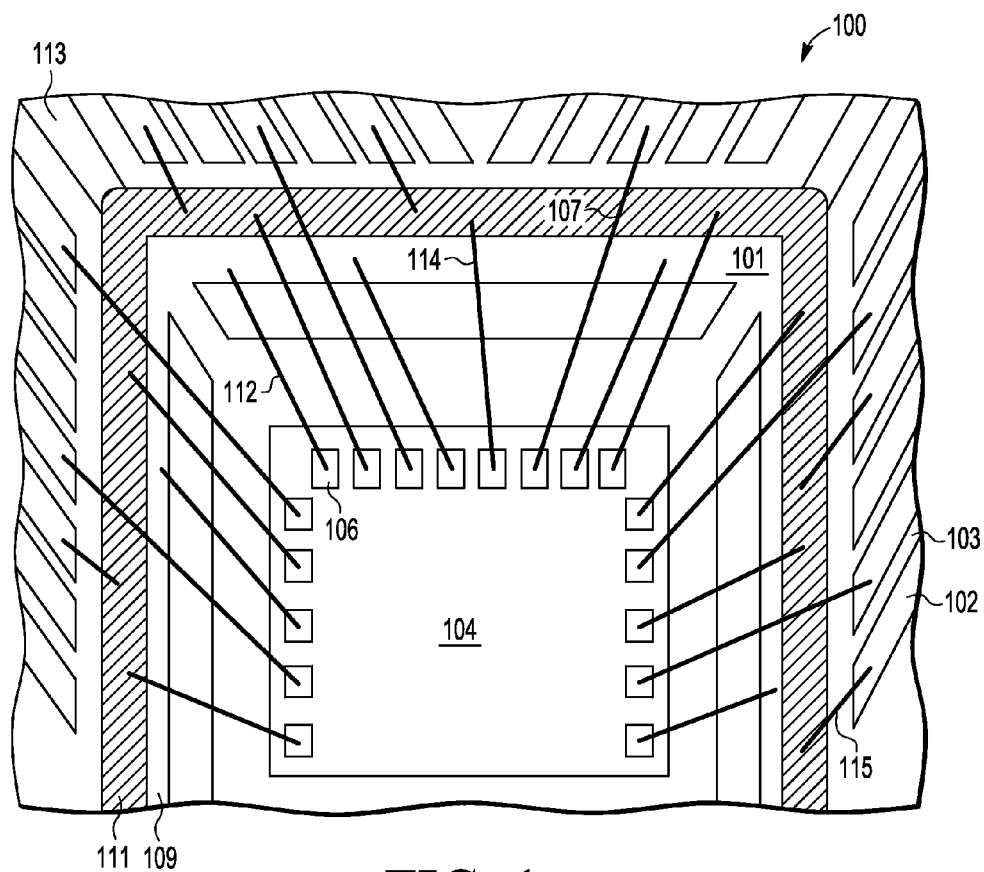
FIG. 1 is a top plan view of a portion of an interior of a partially assembled quad flat package (QFP) type semiconductor device consistent with one embodiment of the invention.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Some embodiments of the invention are semiconductor devices, and other embodiments are methods for assembling semiconductor devices.

In one embodiment, the present invention provides a semiconductor device including a lead frame, an active component, an insulating layer, and a power layer. The lead frame has an interior region and includes a plurality of leads and a first ground ring. The active component has a plurality of die pads and electrical couplings (e.g., bond wires) between at least one of the die pads and at least one of the leads of the lead frame. The active component is disposed in the interior region of the lead frame. The insulating layer is disposed on the first ground ring. The power layer is disposed on the insulating layer. The semiconductor device further includes electrical couplings (i) between the power layer and at least one of the die pads, and (ii) between the power layer and one or more leads of the lead frame.

In another embodiment, the present invention provides a method for manufacturing a semiconductor device. The method includes: (a) disposing, in an interior region of a lead frame having an interior region and comprising (i) a plurality of leads and (ii) a first ground ring, an active component having a plurality of die pads and electrical couplings between at least one of the die pads and at least one of the leads of the lead frame; (b) disposing an insulating layer on the first ground ring; (c) disposing a power layer on the insulating layer; (d) electrically coupling at least one of the die pads to the power layer; and (e) electrically coupling one or more leads of the lead frame to the power layer.

Figure 2:
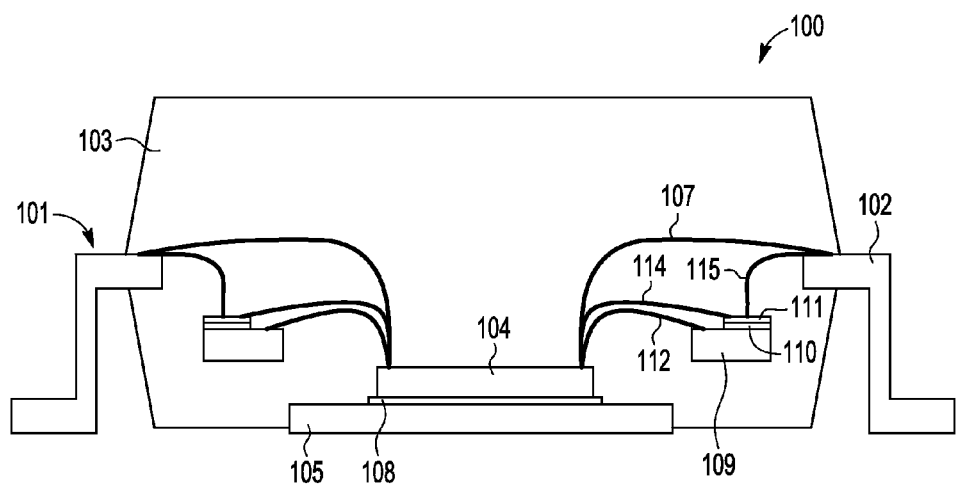
FIG. 2 is a side cross-sectional view of the semiconductor device of FIG. 1.

FIG. 1 is a top plan view of a portion of the interior of a quad flat package (QFP) type semiconductor device 100 in accordance with one embodiment of the invention, and FIG. 2 is a side cross-sectional view of the semiconductor device 100. It is noted that alternative embodiments are not limited to QFP devices, but can be implemented for other package types, such as (without limitation) power QFN (PQFN) packages, ball grid array (BGA) packages, molded array packages (MAP), and quad flat no-lead (QFN) or other no-lead packages.

The semiconductor device 100 comprises a lead frame 101 having multiple metal peripheral leads 102 separated by and embedded within an electrically-insulating molding compound 103. The leads 102 are electrically connected to bonding pads on an integrated circuit (IC) die 104 and/or to external electrical components to allow the IC die 104 to operate with those external components. The leads 102 may be formed of copper, an alloy of copper, a copper-plated iron/nickel alloy, plated aluminum, or the like. Often, copper leads are pre-plated first with a nickel base layer, then a palladium mid-layer, and finally with a very thin, gold upper layer. The molding compound 103 may be an epoxy or other suitable material.

The lead frame 101 functions as a base onto which other elements of the semiconductor device 100 are mounted. In particular, in this embodiment, the lead frame 101 includes a flag or die pad 105 that is exposed (e.g., a ground connection or heat sink) in a lower and central surface thereof. The IC die 104 is mounted on the exposed pad 105 by means of a die-attach layer 108, which may include an epoxy compound, electrically-insulating die-attach adhesive, die-attach tape, solder, or the like. The IC die 104 is a well-known component of semiconductor devices, and thus, a detailed description thereof is not necessary for a complete understanding of the invention.

One or more die bonding pads 106 on an active surface of the IC die 104 are electrically coupled to one or more of the leads 102 of the lead frame 101 with first bond wires 107 to interface with input and output (I/O) connections external to the semiconductor device 100.

As shown in FIGS. 1 and 2, the lead frame 101 includes a square or rectangular shaped ground ring 109 that surrounds the interior region of the lead frame 101. More particularly, in the embodiment shown, the ground ring 109 is disposed between the leads 102 and the die pad 105. The ground ring 109 is used as a hub for one or more ground connections between the die bonding pads 106 and one or more ground connections external to the semiconductor device 100 when the semiconductor device 100 is connected to external components. Accordingly, one or more of the die bonding pads 106 is electrically coupled to the ground ring 109 with second bond wires 112 to interface with ground connections external to the semiconductor device 100, and the ground ring 109 is coupled to the external ground connections via tie bars 113.

According to embodiments of the present invention, the ground ring 109 is used as a support for a power ring structure, thereby yielding a combined power-and-ground ring structure, as will now be described.

In the embodiment of FIG. 1, the combined power-and-ground ring structure is formed as follows. As best seen in FIG. 2, a square or rectangular shaped layer of an insulating material, in this case a polyimide tape 110 is disposed on ground ring 109. The tape 110 forms an insulating layer and may also be an adhesive layer. The tape 110 does not cover the entire surface of ground ring 109, but instead covers only an outermost portion of the ground ring 109, such that an inner portion of the ground ring 109 sufficient for electrical connections to the ground ring 109 made using bond wires 112, as described above, remains exposed.

After the tape 110 is disposed on the ground ring 109, a power ring 111 is formed, e.g., from a square or rectangular shaped layer of copper trace (or other conductive trace, such as copper with silver, nickel, palladium, and/or gold-surface finish) having substantially the same shape, size, and dimensions as the tape 110, and disposed on the tape 110. It should be recognized that a polyimide tape incorporating a conductive trace could be applied in a single process step instead of applying tape layer 110 and power ring 111 in two separate steps.

The power ring 111 is used as a hub for one or more power connections between die bonding pads 106 and one or more power connections external to the semiconductor device 100. Accordingly, one or more of the die bonding pads 106 are electrically connected to the power ring 111 with third bond wires 114, and one or more of the leads 102 are also electrically coupled to the power ring 111 with fourth bond wires 115 to interface with power connections external to the semiconductor device 100.

FIGS. 3-8 show one possible process for assembling the semiconductor device 100 of FIG. 1.

Figure 3:
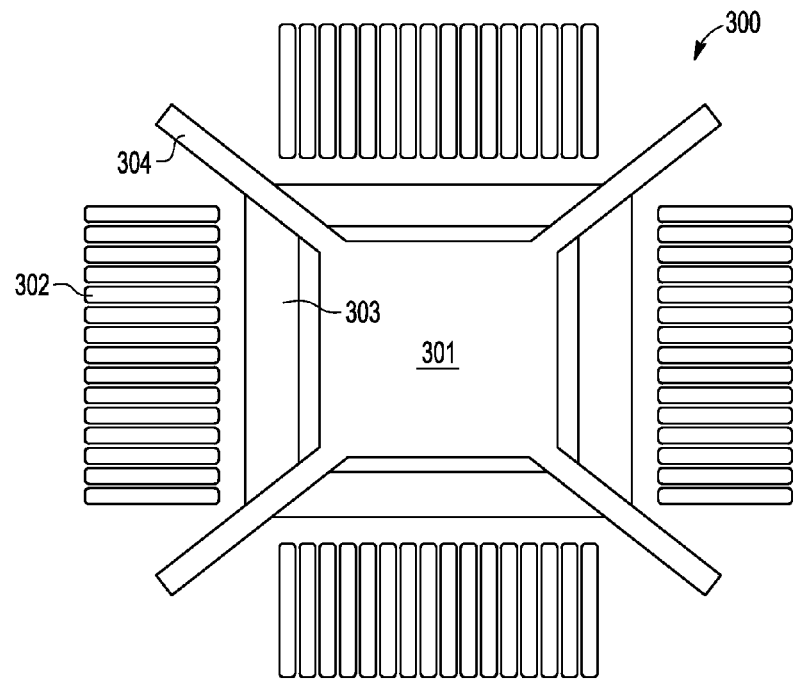
FIGS. 3-8 show one possible process for assembling the semiconductor device of FIG. 1.

In particular, FIG. 3 shows a top plan view of a metal lead frame 300 used to assemble the semiconductor device 100. The lead frame 300 has an exposed pad 301 formed in a central portion thereof and a plurality of leads 302, which surround the pad 301 and are interconnected by an outer frame (not shown). The lead frame 300 also has a square or rectangular shaped ground ring 303. The ground ring 303 surrounds or encircles the pad 301, and itself is surrounded by the leads 302. The pad 301 and ground ring 303 are connected to the outer frame by tie bars 304. The lead frame 300 may be formed of copper, an alloy of copper, a copper-plated iron/nickel alloy, plated aluminum, or the like, and may be fabricated using any suitable technique, such as molding, etching or stamping.

Figure 4:
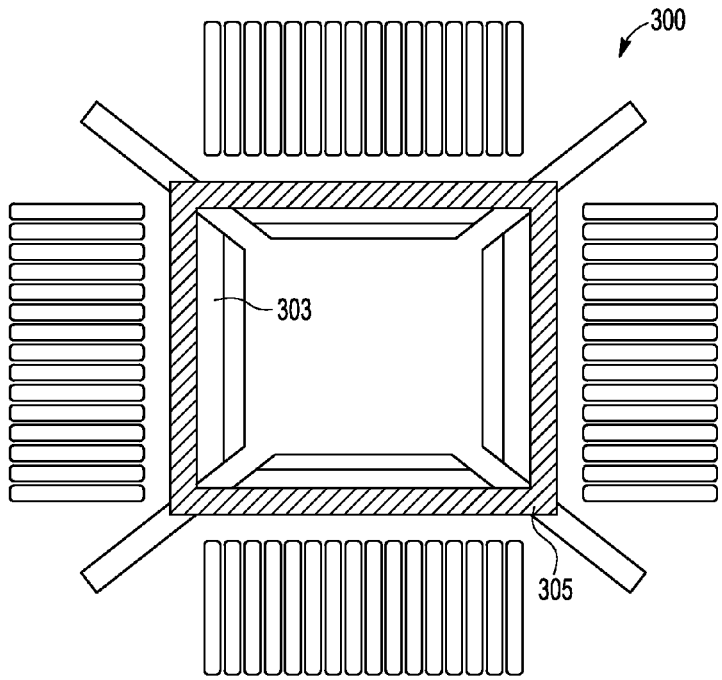

FIG. 4 shows a layer 305 of polyimide tape incorporating a copper trace, applied in a single process step on top of the outermost portion of the ground ring 303. The tape comprises two layers, with the lower layer being an adhesive and insulating polyimide tape layer and the upper layer being a conductive copper trace layer.

Figure 5:
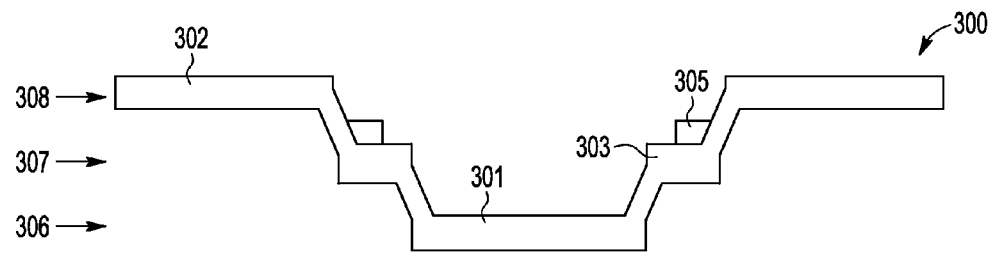

Down-set structures are formed, e.g., by stamping, in tie bars 304. As shown in FIG. 5, as a result of these down-set structures, three distinct lateral planes are defined that are vertically-offset with respect to each other, namely: (i) a first lateral plane 306 defined by the pad 301 (ii) a second lateral plane 307 defined by the ground ring 303, and (iii) a third lateral plane 308 defined by the leads 302.

Figure 6:
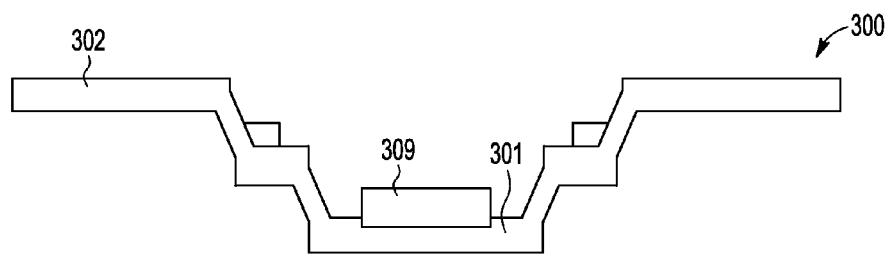

As shown in FIG. 6, an individual IC die 309 is placed on the pad 301, e.g., using conventional pick-and-place machinery. The die 309 may be attached to the pad 301 by means of a die attach adhesive (not shown in FIG. 6, but analogous to layer 105 of FIG. 2.), which may include an epoxy compound, electrically-insulating die-attach adhesive, die-attach tape, solder, or the like.

Figure 7:
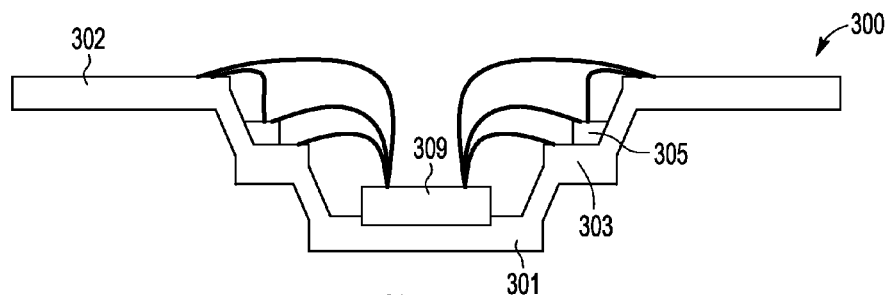

FIG. 7 shows the assembly of FIG. 6 after the addition of bond wires that electrically interconnect the IC die 309 with the leads 302. As discussed in further detail above with respect to FIG. 2, one or more bond wires are wire-bonded: (i) from the die bonding pads of the IC die 309 to the ground ring 303, (ii) from the die bonding pads of the IC die 309 to the power ring (i.e., the copper trace portion of layer 305), (iii) from the die bonding pads of the IC die 309 to the leads 302, (iv) from the ground ring 303 to the leads 302, and (v) from the power ring (i.e., the copper trace portion of layer 305) to the leads 302.

Figure 8:
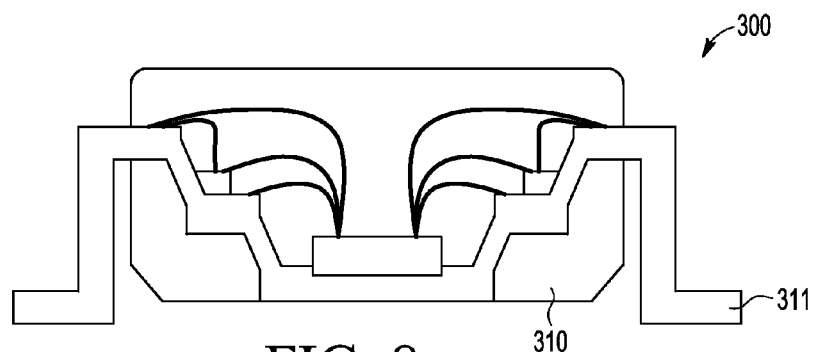

FIG. 8 shows the assembly of FIG. 7 after the addition of a molding compound 310 to encapsulate the assembly of FIG. 7, to reduce stresses that can arise due to thermal-expansion coefficient mismatches between various components of the semiconductor device. The molding compound 310 may be a plastic, an epoxy, a silica-filled resin, a ceramic, a halide-free material, the like, or combinations thereof, as is known in the art. One way of applying the molding compound is using a mold insert of a conventional injection-molding machine, as is known in the art. The molding compound 310 is typically applied as a liquid polymer, which is then heated to form a solid by curing in a UV or ambient atmosphere. The molding compound 310 can also be a solid that is heated to form a liquid for application and then cooled to form a solid mold. Subsequently, an oven is used to cure the molding material to complete the cross linking of the polymer. In alternative embodiments, other encapsulating processes may be used. FIG. 8 also shows leads 311 after being molded, trimmed, and formed.

Figure 9:
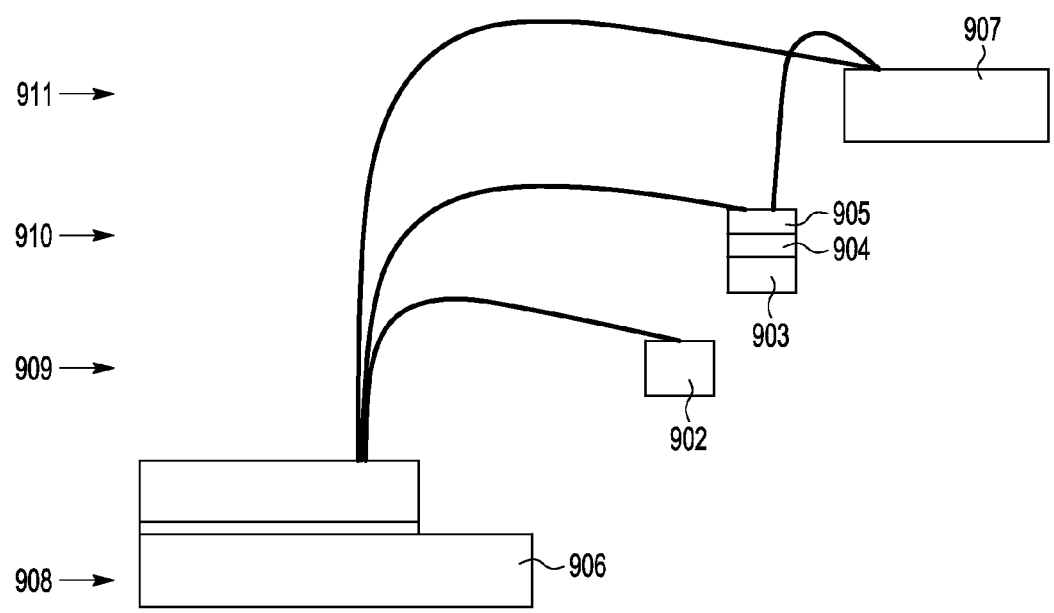
FIG. 9 is a side cross-sectional view of a portion of a semiconductor device consistent with an alternate embodiment of the invention.

FIG. 9 is a side cross-sectional view of a portion of a semiconductor device 900 consistent with an alternative embodiment of the invention. In this embodiment, two separate ground rings are employed, where one of the ground rings includes a polyimide tape incorporating a copper trace disposed on its surface, to improve spacing between power and ground wires.

As shown, the semiconductor device 900 is similar to the semiconductor device 100 of FIG. 1, except that there are two ground rings at different lateral planes, namely, a first ground ring 902 and a second "dummy" ground ring 903, which are coupled to one another, and to ground connections external to the semiconductor device 900, via tie bars (not shown). The dummy ground ring 903 has a tape layer 904 disposed on at least a portion of its surface, or covering its entire surface. Since the first ground ring 902 can be used as a dedicated hub for ground connections, the dummy ground ring 903 does not need to be used to make ground connections, and therefore, the entire surface of the second ground ring 902 can be covered with tape layer 904. A power ring 905 formed, e.g., from a square or rectangular shaped layer of copper trace (or other conductive trace, such as copper with silver, nickel, palladium, and/or gold-surface finish) having substantially the same shape, size, and dimensions as the tape layer 904, is disposed on the tape layer 904. It should be recognized that a polyimide tape incorporating a conductive trace could alternatively be applied in a single process step instead of applying the tape layer 904 and power ring 905 in two separate steps.

In the embodiment of FIG. 9, the combined power and ground ring structure is formed from the dummy ground ring 903, tape layer 904, and power ring 905.

As seen in FIG. 9, as a result of down-set structures formed in tie bars (not shown in FIG. 9), four distinct lateral planes are defined that are vertically-offset with respect to each other, namely: (i) a first lateral plane 908 defined by exposed pad 906, (ii) a second lateral plane 909 defined by first ground ring 902, (iii) a third lateral plane 910 defined by dummy ground ring 903, and (iv) a fourth lateral plane 911 defined by package leads 907. By keeping the first ground ring 902 physically separate and at a different vertically-offset plane with respect to the power ring 905, the semiconductor device 900 provides improved clearance for power and ground wires.

Although FIGS. 1-9 show embodiments of the invention implemented in a semiconductor package with an exposed pad (i.e., an exposed metal plate or the like), it should be recognized that embodiments of the invention could be alternatively be implemented in a semiconductor packages without an exposed pad.

The term "power layer," as used herein, should be understood to include a power ring, as well as any other one or more portions of conductive material that are disposed on the tape layer. For example, FIG. 4 shows tape layer 305 having outer dimensions matching those of ground ring 303, with an inner portion of ground ring 303 remaining exposed for wire-bonding ground connections to ground ring 303. In this embodiment, the power layer comprises the copper traces of tape layer 305 and is also a power ring. However, in some embodiments, the tape layer may be substantially smaller than the ground ring and may comprise one or more smaller portions of tape material disposed on the ground ring. Similarly, in some embodiments, instead of the power ring completely covering the tape layer, the power ring may be smaller than the tape layer and may comprise one or more smaller, possibly discontiguous portions of conductive material that are disposed on the tape layer and coupled to a power source. In these embodiments, the power layer would still comprise the copper traces of the tape layer. In some embodiments, different portions of conductive material may be coupled to different voltages.

Although embodiments of the invention are described herein as involving lead frames that are not premolded, it should be understood that alternative embodiments are possible in which pre-molded lead frames are used.

It should be understood that the invention is not limited to one or more IC dies disposed within a lead frame and/or can be used with one or more other active components disposed within a lead frame as well. Accordingly, the term "active component" should be understood as including any type of circuitry that performs any suitable type of function.

Although embodiments of the invention are described with respect to a quad flat package (QFP), the teachings described herein can be used to fabricate quad flat no lead (QFN) packages, dual flat no lead packages (DFN), and other types of packages where two or more physical bonding-wire segments form a single electrical interconnection between an IC die and a lead frame via a routing substrate.

Bond wires 112, 107, 114, and 115 are formed from a conductive material such as aluminum, silver, gold, or copper, and may be either coated or uncoated.

Although embodiments of the invention are described herein employing pre-plated lead frames, it should be understood that other types of lead frames may be used in other embodiments of the invention.

By now it should be appreciated that there has been provided an improved packaged semiconductor device and a method of forming the improved packaged semiconductor device. Circuit details are not disclosed because knowledge thereof is not required for a complete understanding of the invention.

Although the invention has been described using relative terms such as "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

As used herein, the term "mount," as in "an active component mounted on a substrate" or a step of "mounting an active component on a substrate," covers situations in which the active component is mounted directly onto the substrate with no other intervening components or structures, as well as situations in which the active component is directly mounted to one or more other components and/or structures, which are, in turn, directly mounted to the substrate.

The phrase "substantially annular," as used herein, should be understood to include complete, unbroken rings, as well as broken rings, and rings in multiple segments. "Substantially annular" also includes shapes that comprise portions that may be curved, angular, and/or straight, and should not be interpreted literally to require the presence of a ring, a curved shape, a contiguous shape, or even a single shape.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A semiconductor device, comprising:
   a lead frame having an interior region, a plurality of leads that surround the interior region, and a first ground ring that surrounds the interior region, wherein the first ground ring is generally rectangular and has four sides;
   an integrated circuit die having a plurality of die bonding pads on an active surface thereof, wherein the die is located at the interior region of the lead frame;
   first bond wires that electrically connect first ones of the die bonding pads with first ones of the lead frame leads;
   an insulating layer disposed on the first ground ring, wherein the insulating layer lies on top of and extends over the lengths of the four sides of the first ground ring;
   a power layer disposed on the insulating layer;
   second bond wires between second ones of the die bonding pads and the power layer;
   third bond wires between third ones of the die bonding pads and the ground ring; and
   fourth bond wires between the power layer and second ones of the lead frame leads.

2. The semiconductor device of claim 1, further comprising one or more electrical couplings between the first ground ring and one or more of the die pads.

3. The semiconductor device of claim 1, wherein the insulating layer is formed of a polyimide tape.

4. The semiconductor device of claim 3, wherein the power layer comprises a copper trace formed on the polyimide tape.

5. The semiconductor device of claim 1, wherein the insulating layer and the power layer cover an outermost portion of the first ground ring, and the third bond wires extend from the third ones of the die bonding pads to an inner portion of the first ground ring.

6. The semiconductor device of claim 1, wherein the lead frame is a quad flat package (QFP) lead frame.

7. The semiconductor device of claim 1, wherein the interior region of the lead frame includes a flag and the die is mounted on the flag.

8. The semiconductor device of claim 1, further comprising a second ground ring, wherein the first ground ring is a dummy ground ring.

9. The semiconductor device of claim 8, further comprising one or more electrical couplings between the second ground ring and one or more of the die pads.

10. The semiconductor device of claim 1, further comprising a mold compound that at least partially covers the die, the first, second, third and fourth bond wires, the ground ring, and inner portions of the leads.

* * * * *